US012716977B2

(12) United States Patent
Setsompop et al.

(10) Patent No.: US 12,716,977 B2
(45) Date of Patent: Aug. 25, 2026

(54) HIGH-TEMPORAL RESOLUTION MOTION-ESTIMATION IN MRI DATA ACQUISITION

(71) Applicant: The Board of Trustees of the Leland Stanford Junior University, Stanford, CA (US)

(72) Inventors: Kawin Setsompop, Stanford, CA (US); Yannick Willy E Brackenier, London (GB)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 182 days.

(21) Appl. No.: 18/821,726

(22) Filed: Aug. 30, 2024

(65) Prior Publication Data

US 2025/0076441 A1 Mar. 6, 2025

Related U.S. Application Data

(60) Provisional application No. 63/535,613, filed on Aug. 31, 2023.

(51) Int. Cl.
*G01R 33/567* (2006.01)
*G01R 33/56* (2006.01)
*G01R 33/561* (2006.01)
*G01R 33/565* (2006.01)

(52) U.S. Cl.
CPC ..... *G01R 33/5676* (2013.01); *G01R 33/5608* (2013.01); *G01R 33/5611* (2013.01); *G01R 33/56509* (2013.01)

(58) Field of Classification Search
None
See application file for complete search history.

(56) References Cited

U.S. PATENT DOCUMENTS

2007/0090837 A1* 4/2007 Van Der Kouwe .......................... G01R 33/5676 324/307
2021/0373105 A1* 12/2021 Polak .............. G01R 33/56509

FOREIGN PATENT DOCUMENTS

EP 4253986 A1 * 10/2023 ....... G01R 33/56509

OTHER PUBLICATIONS

Brackenier et al. Rapid and accurate navigators for motion and B0 tracking using QUEEN: Quantitatively enhanced parameter estimation from navigators. Magn Reson Med. 2024; 91: 2028-2043.
Wallace et al. Rapid measurement and correction of spatiotemporal B0 field changes using FID navigators and a multi-channel reference image. Magn Reson Med. 2020;83(2):575-89.
Polak et al. Motion guidance lines for robust data consistency-based retrospective motion correction in 2D and 3D MRI. Magn Reson Med. 2023;89(5):1777-90.

(Continued)

*Primary Examiner* — Rodney E Fuller
(74) *Attorney, Agent, or Firm* — LUMEN PATENT FIRM

(57) ABSTRACT

A method for magnetic resonance imaging with motion estimation comprises: a) performing with a magnetic resonance imaging apparatus a quantitative scout acquisition to produce a data acquisition sequence; b) predicting, based on the data acquisition sequence, navigator data throughout an entirety of the data acquisition sequence; and c) performing joint motion and $\delta B_0$ estimation from the navigator data.

8 Claims, 6 Drawing Sheets

(56) References Cited

OTHER PUBLICATIONS

Polak et al. Scout accelerated motion estimation and reduction (SAMER). Magn Reson Med. 2021;(June):1-16.

Wallace et al. Head motion measurement and correction using FID navigators. Magn Reson Med. 2019;81(1):258-74.

Kober T, Marques JP, Gruetter R, Krueger G. Head motion detection using FID navigators. Magn Reson Med. 2011;66(1):135-43.

* cited by examiner (A) Q-Scout: Low-res quantitative scout
PD
T1
T2
100
102
(B) Predicting navigator contrast
104
(C) QUEEN optimization
Motion and $\delta B_0$
$\hat{z}, \hat{c} = argmin_{z,c} \sum_{n=1:N} \left\| F_n ST(z) P_n(c) Q_{s_n} - y_n \right\|_2^2$
106
(D) SPINGS: Rapid Navigator
$k_z$
$k_y$
$k_x$
3.5 ms
108
(E) Navigator signal
(E.I) Steady state sequences (e.g., GRE)
Acquisition
Nav
Imag
Signal
~R2*
(E.II) Non-steady state sequences (e.g., MP-RAGE)
110
~T1

(A) Translation
(B) Rotation
(C) $\delta B_0$
(I) HV 1
(II) HV 2
200
202
204
206
208
210
motion + $\delta B_0$
uncorrected
motion only
$\mu$ = 2.22
$\mu$ = 3.79
Uncorrected
Motion only QUEEN
Motion + $\delta B_0$ QUEEN
Count [#]
Translational error [mm]
Rotation error [°]
$\delta B_0$ error [Hz]

(I) Translation (II) Rotation

Figure 4:
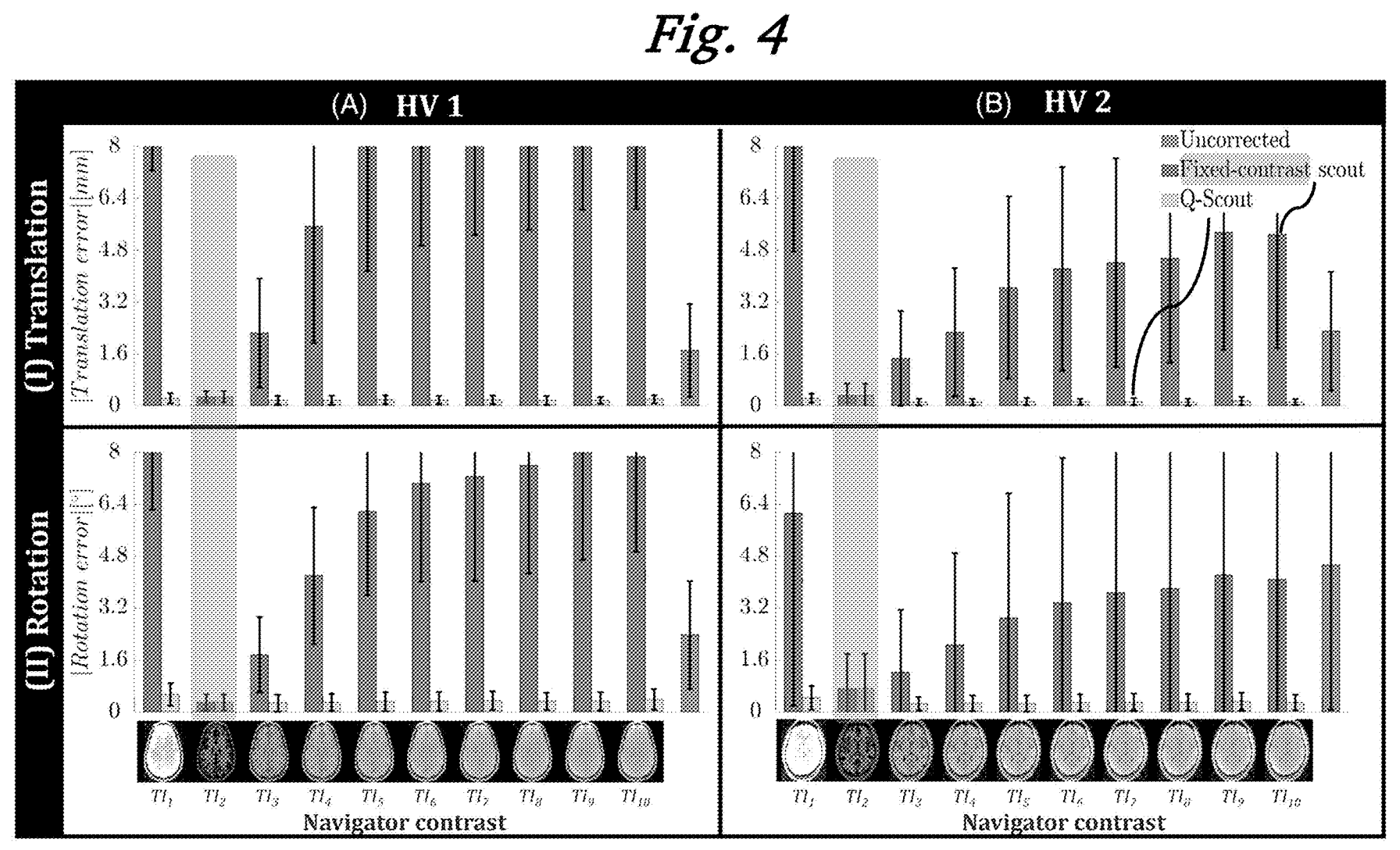

Translation error [mm]

Rotation error [°]

Uncorrected

Fixed-contrast scout

Q-Scout $TI_1$ $TI_2$ $TI_3$ $TI_4$ $TI_5$ $TI_6$ $TI_7$ $TI_8$ $TI_9$ $TI_{10}$ Navigator contrast

| | Experiments | | | Reference |
|---|---|---|---|---|
| | (A) Uncorrected | (B) Motion corrected Fixed-contrast scout | (C) Motion corrected Q-scout | (D) Ground Truth |
| (I) Recon sagittal | | | | |
| (II) Error (x10) sagittal | | | | |
| (III) Recon Axial | | | | |
| (IV) Error (x10) Axial | SRR = 9.2 dB | SRR = 12.0 dB | SRR = 21.7 dB | |

*Fig. 6*

HIGH-TEMPORAL RESOLUTION MOTION-ESTIMATION IN MRI DATA ACQUISITION

CROSS-REFERENCE TO RELATED APPLICATIONS

This application claims priority from U.S. Provisional Patent Application 63/535,613 filed Aug. 31, 2023, which is incorporated herein by reference.

STATEMENT OF FEDERALLY SPONSORED RESEARCH

This invention was made with Government support under contracts EB019437, EB025162, EB030006, EB033206, MH116173, and NS129893 awarded by the National Institutes of Health. The Government has certain rights in the invention.

FIELD OF THE INVENTION

The present invention relates generally to medical imaging. More specifically, it relates to techniques for patient motion estimation in magnetic resonance imaging.

BACKGROUND OF THE INVENTION

Spatial (k-space) encoding in the magnetic resonance imaging (MRI) acquisitions is slow, making MRI susceptible to patient motion, causing blurring and artifacts to the reconstructed images. Fast navigators, e.g. FID, Guidance lines, and short k-space navigators, provide motion tracking by matching short dedicated k-space measurements to a reference acquisition (scout). Conventional scout acquisitions are intrinsically single contrast, limiting navigator placement to points in the sequence where signal contrast is matched to the scout, thereby limiting the achievable temporal resolution in the tracking of motion.

SUMMARY OF THE INVENTION

Disclosed here is a framework for MRI that uses a quantitative scout acquisition (Q-Scout) that is used to predict the signal contrast throughout the whole acquisition sequence. This allows navigator placement anywhere in the sequence, as navigator contrast can be predicted using the sequence timings.

This approach can be used to estimate patient motion in sequences with pseudo-transient signal variations (e.g., inversion recovery sequences) or pure transient sequences (e.g., magnetic resonance fingerprinting).

The technique performs motion and $\delta B_0$ estimation from navigator data that can be placed at any timepoint within the data acquisition sequence by using data from a Q-Scout pre-scan acquisition. The technique also includes the acquisition and reconstruction of the Q-Scout pre-scan. The invention also includes an approach to quickly acquire a low-resolution pre-scan for use to provide stable motion estimation.

This technique may be used to correct undesirable motion in acquisition where motion occurs that cannot be corrected using current scout-based techniques. Sequences that could benefit from this are for example MPRAGE, MRF, turbo-spin echo where navigators are usually inserted only every imaging cycle, resulting in a slow motion-tracking resolution in multiple seconds timeframe.

A key improvement of the current method is the extension of single-contrast scout data to Q-Scout information that predicts navigator contrast throughout the entire sequence.

The technique may be implemented as part of MRI acquisition and software package of MRI acquisition and reconstruction on an MRI scanner.

In one aspect, the invention provides a method for magnetic resonance imaging with motion estimation, the method comprising: a) performing with a magnetic resonance imaging apparatus a quantitative scout acquisition to produce a data acquisition sequence; b) predicting, based on the data acquisition sequence, navigator data throughout an entirety of the data acquisition sequence; and c) performing joint motion and $\delta B_0$ estimation from the navigator data.

In some implementations, the quantitative scout acquisition comprises a 4 mm or more isotropic resolution quantitative mapping sequence in the time order of a couple of seconds, resulting in maps to predict signal contrast throughout the data acquisition sequence. In some implementations, the data acquisition sequence comprises acquisition time of at least 2 ms allotted for short navigators. In some implementations, predicting navigator data comprises using a signal model and an imaging acquisitions structure to predict signal variation across the data acquisition sequence. In some implementations, the navigator data comprises time-varying image contrast-matched scout navigator data. In some implementations, performing joint motion and $\delta B_0$ estimation comprises performing a model-based joint estimation of both rigid patient motion and polarizing magnetic field perturbations. In some implementations, performing joint motion and $\delta B_0$ estimation comprises estimating motion parameters and $\delta B_0$ parameters iteratively using a Levenberg-Marquardt algorithm. In some implementations, the method further comprises reconstructing an MRI image using the estimated motion and $\delta B_0$.

BRIEF DESCRIPTION OF THE DRAWINGS

FIG. 4 shows bar plots of the absolute errors in translation (top row) and rotation (bottom row) for the motion estimation from in-vivo acquired SPINS navigators acquired in different poses and at 10 different contrasts for HV 1 (left column) and HV 2 (right column).

FIG. 6 shows inter-pose image correction using MPARGE data.

DETAILED DESCRIPTION OF THE INVENTION

Figure 1:
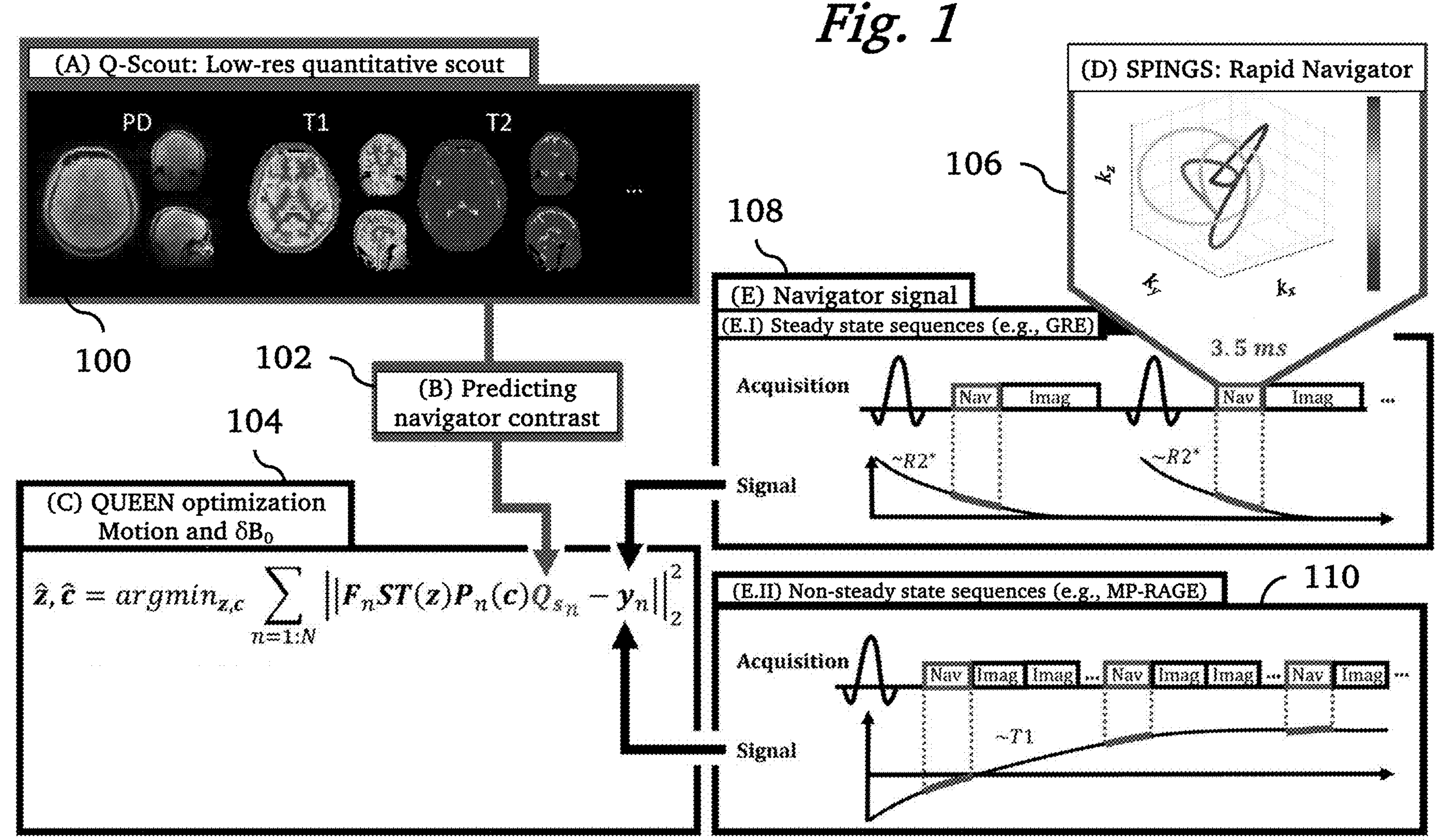
FIG. 1 is a schematic overview of a framework using a quantitative scout to predict image contrast during navigator acquisition, according to an embodiment of the invention.

Disclosed herein is a framework to jointly estimate rigid motion and polarizing magnetic field ($B_0$) perturbations $\delta B_0$ for brain MRI using a single navigator of a few milliseconds in duration. It additionally allows for navigator acquisition at arbitrary timings within any type of sequence to obtain high-temporal resolution estimates.

Previous methods exist that match navigator data to a low-resolution single-contrast image (scout) to estimate either motion or $\delta B_0$. In the present work, called Quantitatively-Enhanced parameter Estimation from Navigators (QUEEN), we provide a technique for combined motion and $\delta B_0$ estimation from a fast, tailored trajectory with arbitrary-contrast navigator data. To this end, the concept of a quantitative scout (Q-Scout) acquisition is described from which contrast-matched scout data is predicted for each navigator. Finally, navigator trajectories, contrast-matched scout and $\delta B_0$ are integrated into a motion-informed parallel imaging framework.

Simulations and in-vivo experiments show the need to model $\delta B_0$ to obtain accurate motion parameters estimated in the presence of strong $\delta B_0$. Simulations confirm that tailored navigator trajectories are needed to robustly estimate both motion and $\delta B_0$. Furthermore, experiments show that a contrast-matched scout is needed for parameter estimation from multi-contrast navigator data. A retrospective, in-vivo reconstruction experiment shows improved image quality when using the proposed Q-Scout and QUEEN estimation.

The present framework jointly estimates rigid motion parameters and $\delta B_0$ from navigators. Combing a contrast-matched scout with the proposed trajectory allows for navigator deployment in almost any sequence and/or timing, which allows for higher-temporal resolution motion and $\delta B_0$ estimates.

INTRODUCTION

Due to long scan times, MRI is susceptible to changes in data acquisition, causing artifacts in the reconstructed images. For brain MRI in particular, patient motion and changes in the polarizing magnetic field ($B_0$) are known to contaminate the MR signal. Although non-rigid motion is known to occur, head motion is usually approximated as rigid. Similarly, $B_0$-perturbations ($\delta B_0$) are often represented using a set of low-order spatial basis functions (e.g. to model respiratory-induced $\delta B_0$) although higher-order terms exist (e.g. pose-dependent susceptibility induced $\delta B_0$). As the higher-order terms are especially relevant at ultra-high field MRI, this work, performed at 3T, focuses on the low-order approximation.

Prospective and retrospective motion and/or $\delta B_0$ correcting schemes have been proposed which pursue motion and $B_0$ tolerant imaging. For both prospective and retrospective motion and $\delta B_0$ correction, estimates of these time-varying parameters are needed. One estimation technique involves the use of navigators, which are dedicated encoding blocks added to the acquisition sequence that encode relative changes in motion and/or $\delta B_0$ that can be retrieved using different strategies. In one strategy, parameters can be retrieved by matching the navigator data to a low-resolution multi-coil reference image (scout) using a model-based approach. Scout data can be acquired quickly. For the remainder of this work, navigators using a scout will be referred to as "scout-based navigators". This strategy enables motion estimation from Free Induction Decay (FID) signal. FID navigators are short enough so that they can replace or precede image encoding blocks within the repetition time TR of any sequence, which is desirable to provide flexible navigator deployment. Using the idea of a scout acquisition, the SAMER approach was proposed to incorporate the scout data into a data-driven motion estimation to improve accuracy and computation time from more general k-space encodings. Subsequently, a "Guidance-lines" trajectory (4 k-space lines placed across 4 TRs in the sequence) was proposed to improve robustness compared to the FID when estimating motion, whilst minimally impacting the sequence structure.

Although scout-based FID navigators have been proposed for either motion or $\delta B_0$ estimation, a model-based joint estimation of both motion and $\delta B_0$ has not previously been proposed in the literature. This work describes a framework to allow joint motion and $\delta B_0$ estimation from a single (non-cartesian) navigator using a separately acquired scout.

Previous scout-based navigators utilize a single-contrast scout, limiting their usage to certain timings in a sequence where the navigator contrast matches the scout. Improving upon this, the present quantitative scout (Q-Scout) can predict the navigator contrast at time of acquisition and enables navigator placement in almost any sequence and/or timing. A technique described herein called "Quantitatively-Enhanced parameter Estimation from Navigators (QUEEN)" leverages the Q-Scout predicted navigator contrast when estimating motion and/or $\delta B_0$.

In the present technique, a navigator trajectory is deployed that encodes the spatial information needed to estimate motion akin to "Guidance lines" navigator but is short enough in duration to fit within almost any TR, akin to an FID navigator, to allow flexible usage. Furthermore, as estimating motion and $\delta B_0$ are not separate problems, a tailored navigator design is desired that allows for joint motion and $\delta B_0$ estimation.

To summarize, key components of this technique include QUEEN motion and $\delta B_0$ estimation from navigator data with arbitrary trajectory and contrast, a quantitative scout (Q-Scout) to predict the navigator contrast at the time of navigator acquisition, and a tailored, fast, motion- and $\delta B_0$-sensitized navigator trajectory.

Theory

SAMER Motion Estimation

For volumetric encoding using array receiver coils and Cartesian sampling, the "Scout accelerated motion estimation and reduction (SAMER)" framework achieves fast motion estimation from a group of k-space readouts by turning the alternating motion and image estimation of the aligned SENSE framework into a single motion estimation. The latter is achieved by replacing the otherwise unknown image x in the forward signal model with a separately acquired reference image (scout): $x \rightarrow x_s$:

$$y = AFST(z)x_s \tag{1}$$

where S are the sensitivity profiles of the coil receiver array, F the discrete Fourier transform (DFT), T(z) is the rigid motion operator with 6 rigid motion parameters z, A the sampling mask and y the measured data for all coil elements. As a low-resolution scout $x_s$ is often sufficient to estimate rigid motion, it can be acquired quickly (~3 s) and therefore contains minimal motion artefacts. Rigid motion estimation is then formulated as the inverse problem:

$$\hat{z} = \operatorname{argmin}_z \|AFST(z)x_s - y\|_2^2 \tag{2}$$

Whereas joint motion and image estimation methods require tailored encoding strategies (e.g. grouping 100*s* of carefully placed readouts per motion estimate in DISORDER), the use of a scout allows for less constrained k-space encodings to estimate motion from. As an example, using only 4 k-space readout lines ("Guidance lines") still allows reliable motion estimation.

Q-Scout-Informed Signal Model

The SAMER framework is suited for estimating motion from a small amount of acquired k-space data which has a matching image contrast to that of the (single-contrast) scout image. Therefore, motion estimation from navigators in non-steady-state sequences, where contrast is changing, will be limited to those navigators which are contrast-matched to the scout. For example, SAMER estimation in MPRAGE sequences will result in a single motion estimate per inversion recovery as within-inversion signal changes are currently not modelled by $x_s$. To overcome this, we propose the concept of a quantitative scout (Q-Scout) that predicts the time-varying navigator signal (FIG. 1) $x_s \rightarrow Q_s(t)$. The Q-Scout should contain the information needed to predict all relevant contrast variations throughout the navigator acquisition. For example, in steady-state sequences like GRE, parameter estimation will benefit from modeling T2* and baseline $B_0$ in $Q_s(t)$ to accurately describe the temporal signal variation across the navigator acquisition.

Analogous to the fixed-contrast scout, the Q-Scout can be acquired at a low resolution to provide accurate estimation of rigid brain motion and low-order $\delta B_0$. As such, fast quantitative imaging sequences such as MRF (31) and EPTI (32) can be deployed to acquire quantitative maps at the required resolution in a 10-20 s timeframe. As this work proposes a novel framework with a focus on introducing individual components (e.g. Q-Scout contrast prediction), dedicated Q-Scout acquisitions have not been developed yet and a proof-of-concept alternative was used instead (see Methods).

$B_0$-Perturbation-Informed Signal Model

The baseline $B_0$ is (or can be) known and can be modeled in $Q_s(t)$, whereas $\delta B_0$ cannot. Therefore, this work models $\delta B_0$ as a separate operator in the forward model. $\delta B_0$ is represented using a set of solid harmonics (SH) ($\delta B_0 = Lc$ with SH basis L and coefficients c) where c is estimated from each navigator acquisition. The effect of $\delta B_0$ (and similarly other within-navigator signal changes) is modelled using a time-segmented approach for segments n=1:N at time $t_n$ and are incorporated in a motion- and $\delta B_0$-informed signal model:

$$y_n = A_n F S T(z) P_n(c) Q_{s_n} \tag{3}$$

where $A_n$ is the segment-dependent sampling mask, $P_n$ the $\delta B_0$-induced phase $e^{2\pi \delta B_0 t_n} = e^{2\pi i L c t_n}$ and $Q_{s_n}$ the Q-Scout-predicted navigator contrast at time $t_n$. Note that baseline $B_0$ is implicitly modelled in $Q_{s_n}$ as $e^{2\pi i B_0 t_n}$. For the remainder of this work, $2^{nd}$ order SH are considered, following previous work.

Motion- and $B_0$-Sensitised Navigator Design

A navigator trajectory was designed to quickly sample a k-space subset that is sufficient to estimate motion and $\delta B_0$. The spiral nonselective (SPINS) trajectory (33), which is a type of 3D spiral-in trajectory originally designed for transmit ($B_{1^+}$)-mitigated radiofrequency (RF) excitation, is deployed in this work due to its rapid acquisition and sensitivity to rigid motion and $\delta B_0$: arc-like sampling sensitizes signal to rotation and translation. Furthermore, in contrast to spherical-like trajectories, the SPINS trajectory can leverage the signal to noise (SNR) at the origin whilst still sampling k-space features at outer radii. $\delta B_0$-sensitivity is obtained by sampling the k-space origin at the start and the end of the navigator trajectory. The SPINS trajectory k(t) was designed using Equations 1-3 from (33) with u=3.5 2π/4 rad/ms, v=3.5 2π/4 rad/ms, α=3, β=½, which were chosen after manual ad-hoc parameter testing. $k_{max}$ was set to π/4 rad/mm as scout data at 4 mm isotropic resolution is used in this work. To make the start and end of the trajectory smooth, spline interpolation was performed at both edges. Finally, the navigator duration was minimized using gradient trajectory optimization using a maximum slew rate $S_{max}$=100 mT/m/ms and a maximum gradient $G_{max}$=50 mT/m (34), resulting in a navigator duration of 3.5 ms, which is short enough to fit in almost any repetition time (TR). A 3D visualization of the trajectory is shown in FIG. 1. Since the SPINS trajectory is non-cartesian, the Fourier transform and sampling mask in Eq. 3 have been replaced by the non-uniform Fourier transform: $A_n F \rightarrow \mathcal{F}_n$:

$$y_n = \mathcal{F}_n S T(z) P_n(c) Q_{s_n}. \tag{4}$$

Queen

Whereas the Q-Scout predicts the time-varying navigator signal $Q_{s_n}$ (FIG. 1), QUEEN refers to the estimation of motion and $\delta B_0$ parameters:

$$\hat{z}, \hat{c} = \operatorname{argmin}_{z,c} \sum_{n=1:N} \left\| \mathcal{F}_n S T(z) P_n(c) Q_{s_n} - y_n \right\|_2^2. \tag{5}$$

Motion and $\delta B_0$ parameters are iteratively estimated using the Levenberg-Marquardt algorithm:

$$z^{i+1} = \operatorname{argmin}_z \sum_{n=1:N} \left\| \mathcal{F}_n S T(z) P_n(c^i) Q_{s_n} - y_n \right\|_2^2, \quad c^{i+1} = \operatorname{argmin}_c \sum_{n=1:N} \left\| \mathcal{F}_n S T(z^{i+1}) P_n(c) Q_{s_n} - y_n \right\|_2^2. \tag{6}$$

Methods

FIG. 1 is a schematic overview of a method according to an embodiment of the invention. A low-resolution quantitative scout (Q-Scout) 100 can be acquired using a rapid pre-scan to predict image contrast during navigator acquisition in any type of sequence using the sequence parameters and an appropriate signal model 102. Navigator contrast is included in a motion- and $\delta B_0$-informed parallel imaging model to estimate motion and $\delta B_0$ parameters (respectively z and c) using QUEEN 104. A rapid (3.5 ms) tailored SPINS navigator trajectory 106 was deployed that can flexibly be inserted in most sequences and/or timings to estimate motion and $\delta B_0$ variations, here shown for a steady-state GRE 108 and a non-steady state MPRAGE 110.

As this work contains multiple novel components, simulations and experiments aim to dissect the behavior and contribution of each component independently. Therefore, the method sections are organized in the following way:

First, Simulations 1 & 2 are performed to test:

Hypothesis 1: QUEEN joint motion and $\delta B_0$ estimation is needed in the presence of $B_0$ perturbations, and an optimized navigator trajectory is desired.

Hypothesis 2: Q-Scout contrast prediction is needed when performing QUEEN on multi-contrast navigator data.

Next, Experiments 1 & 2 test these hypotheses in-vivo.

Finally, Experiments 3 is performed to test Hypothesis 3: image artefacts from motion and $\delta B_0$ can be corrected using QUEEN-estimated parameters.

Simulations: Pose Experiment

Simulation 1 (QUEEN) tests Hypothesis 1 by synthesizing navigator data for a range of poses and $\delta B_0$, for both the SPINS and FID navigator. For all synthesized navigator signals, motion is estimated by either ignoring $\delta B_0$ ("motion only") or joint QUEEN estimation ("motion+$\delta B_0$"). Simulation 2 (Q-Scout) tests Hypothesis 2 by synthesizing SPINS navigator data for a range of poses and signal contrasts. Motion is estimated using either the correct navigator contrast ("Q-Scout") or a fixed contrast ("Fixed-contrast scout"). Pose parameters for each pose are randomly generated from the uniform distribution ±5 mm/° and $\delta B_0$ are synthetized to result in a range of −20→20 Hz across the head. Further details and results of the simulation can be found in Supporting Information Section 1.

In Vivo: Pose Experiment

Experiment 1 (QUEEN) tests Hypothesis 1 in-vivo by modifying a multi-echo GRE sequence. The SPINS navigator trajectory was inserted before every image readout. The modified GRE sequence was acquired on two consented adult healthy volunteer (HV) subjects on a 3T scanner (GE UHP, GE Healthcare, Milwaukee, USA) using a 32-element adult head coil array. Additional sequence parameters: 4.77 ms between RF excitation and SPINS navigator, echo time TE=9.83/10.72/11.63/12.52/13.43 ms, repetition time TR=40 ms, flip angle FA=20°, 2 mm isotropic resolution, FOV=220×220×220 $mm^3$, fat-suppressed excitation using SLfRank pulse design, scan duration TA=4 min 15 s. To obtain the navigator and the fully sampled imaging data at multiple head poses, scans were acquired with the subject holding a different static pose within each acquisition; 5 and 7 poses respectively for the first and second HV. Additionally, from the second acquisition onwards, the forearms were placed on the chest as an additional source of susceptibility-induced $\delta B_0$ in the head that has a spatial distribution that can be modelled using the SH basis. The validity of this hypothesis was confirmed when fitting the ground truth (GT) $\delta B_0$ with the SH basis L. Coil sensitivities were estimated using the first echo image of the first pose by using the BART implementation of ESPIRiT.

For each pose acquisition, three processing steps were performed. First, individual echo images were reconstructed using SENSE. Gradient delays were estimated using reversed-polarity reference data. Eddy-currented effects between odd and even echoes were corrected by removing the non-linear temporal phase evolution between odd and even echoes. Secondly, a voxel-wise T2*, PD and $B_0$ fitting was performed on all echo images using a mono-exponential fit on the magnitude images (PD and T2*) and the phase images ($B_0$). Finally, pose parameters with respect to the first (reference) pose were estimated from SPINS data using QUEEN by either ignoring $\delta B_0$ ("motion only") or joint QUEEN estimation ("motion+$\delta B_0$"). To limit computation time, a subset of only 10 SPINS navigators with a 2 s interval were extracted from each pose.

Q-Scout information was generated by down-sampling the quantitative maps from the reference pose to 4 mm isotropic resolution. Estimated motion and $\delta B_0$ parameters were compared to the GT: GT motion parameters $z_{GT}$ were obtained from registering the reconstructed images and GT SH coefficients $c_{GT}$ were obtained by performing a weighted least-squares (LS) fit on $\delta B_{0_{GT}}$:

$$c_{GT} = \operatorname{argmin}_c \left\| W\left(\delta B_{0_{GT}} - Lc\right)\right\|_2^2 \tag{7}$$

where W is brain mask and $\delta B_{0_{GT}}$ is obtained from subtracting the registered $B_0$ maps.

Experiment 2 (Q-Scout) tests Hypothesis 2 in-vivo and uses a modified MPRAGE sequence with an incoherent spiral-projection encoding (31) that is adopted for later reconstruction (see below). Additional sequence parameters: a 8475 ms TR between inversion times ($TR_{long}$), a dummy inversion followed by 47 inversions each containing 500 readouts with a 14.5 ms TR between readout excitations ($TR_{short}$), a 15.2 ms dead-time between the inversion pulse and the first readout, a 1209.8 ms recovery time between the last readout and the next inversion pulse, TE=1.56 ms, FA=8°, 1 mm isotropic resolution, FOV=220×220×220 $mm^3$, TA=7 min 18 s. A SPINS navigator was placed every $50^{th}$ $TR_{short}$ to obtain navigator data throughout the entire inversion recovery, totaling 10 navigators per inversion at $TI_i=1+50(i-1))*TR_{short}$ where i=1:10. Each SPINS navigator replaces the imaging readout and is not inserted before each image readout (resulting in a small 2% loss in imaging efficiency). This sequence was acquired on two HVs on a 3T scanner (GE Premier) using a 48-element adult head coil array. For both HVs, 5 scans were acquired with the subject holding a different static pose within each scan to get imaging and navigator data in multiple poses. For the first (reference) pose, an additional acquisition at TE=4 ms was acquired to obtain the baseline $B_0$.

To obtain the Q-Scout data in the reference pose, the time varying image contrast $Q_s$ was directly reconstructed from the acquired imaging data to ensure synchronized Q-Scout and imaging data. Temporal volumetric $Q_s$ is estimated by using a time-resolved subspace signal model $Q_s \cong \Phi\alpha$ where $\Phi$ are the temporal basis functions and a the corresponding volumetric coefficient maps. $\Phi$ is a generated dictionary of signal evolutions for a range of T1/T2/inversion- and $B1^+$ efficiencies using the EPG framework. $\Phi$ is SVD-compressed to 5 components. Using the incoherent encoding, $\alpha$ was estimated with the pics (parallel imaging and compressed sensing) implementation in BART:

$$\hat{\alpha} = \operatorname{argmin}_\alpha \|\mathcal{F}S\Phi\alpha - y\|_2^2 \tag{8}$$

where S are the sensitivity profiles and $\mathcal{F}$ the non-uniform Fourier transform for the spiral-projection trajectory. Coil sensitivities were estimated by inverse gridding the acquired data for each coil individually and performing ESPIRiT in BART.

For each pose, two processing steps were performed. First, coefficient maps $\hat{\alpha}$ were estimated using Eq. 8 only to perform image registration and obtain z GT with respect to the reference pose. To reduce computational load, reconstructions were performed directly at 4 mm isotropic resolution. Registration was performed on the first coefficient map. Secondly, the 10 SPINS acquisitions within the inversion were extracted and used to estimate motion and $\delta B_0$ parameters (with respect to the reference pose) using either a fixed-contrast scout (arbitrarily taken as $TI_2$: $Q_s=\Phi(:,101)\alpha$) or Q-Scout-predicted contrast for each navigator i ($Q_{s_i}=\Phi(:,1+50\ (i-1))\alpha$). To limit computation time, a subset of only 5 inversion recoveries were extracted from each pose.

Since each acquisition contains both the Q-Scout imaging data and SPINS navigators, a self-consistency check was performed within each pose by predicting the SPINS navigator signal using the Q-Scout and the QUEEN signal model. A detailed analysis can be found in Supporting Information Section 2 and resulted in ad-hoc corrections to the navigator data before performing Eq. 6: a phase correction was performed for both experiments and the SPINS trajectory was cropped for Experiment 2 due to signal model imperfections.

In Vivo: Inter-Pose Motion Experiment

Experiment 3 (inter-pose image correction) evaluates the ability to use the QUEEN estimates to correct image artifacts caused by motion and $\delta B_0$. A retrospective experiment is performed by synthesizing a k-space dataset $y_{synthetic}$ that combined k-space data from 5 poses into a single dataset. Experiment 3.I and 3.II use data acquired in Experiment 1 (GRE) and 2 (MPRAGE), respectively. Image reconstruction is performed on $y_{synthetic}$ using a motion- and $\delta B_0$-informed signal model:

$$\hat{x} = \mathrm{argmin}_x \sum_{n=1:5} \|\mathcal{F}_n S T(z_n) P_n(c_n) x - y_{synthetic,n}\|_2^2 \quad (9)$$

where $z_n$ and $c_n$ are the estimated motion and $\delta B_0$ parameters for pose n. Eq. 9 was solved using the MATLAB implementation of the preconditioned conjugate gradient algorithm.

Experiment 3.I uses the first echo image from the multi-pose GRE data in HV1. Since the GRE data was Cartesian, k-space from each pose is allocated to $y_{synthetic}$ by binning the first phase encoding into 5 linear segments. Synthesized data was reconstructed at the original 2 mm isotropic resolution in four different ways:

1. "uncorrected", without motion or $\delta B_0$ modelling ($z_n$=0, $c_n$=0, corresponding to SENSE),
2. "motion corrected" using motion estimates from the motion only optimization ($z_n = \widehat{z_{n_{Motion\ only}}}$, $c_n$=0),
3. "motion corrected, $\delta B_0$ informed" using motion estimates from the motion+$\delta B_0$ optimization but without incorporating the estimated $\delta B_0$ into the reconstruction ($z_n = \widehat{z_{n_{Motion+\delta B_0}}}$, $c_n$=0) and
4. "motion+$\delta B_0$ corrected" using motion and $\delta B_0$ estimates from the motion+$\delta B_0$ optimization ($z_n = \widehat{z_{n_{Motion+\delta B_0}}}$, $c_n = \widehat{c_{n_{Motion+\delta B_0}}}$).

Experiment 3.II uses a subset from the MPRAGE data to achieve contrast between white and grey matter. Therefore, 40 $TR_{short}$ around $TI_3$ was extracted from each pose in HV 1. Note that a window of 40 was used as a single spiral arm per inversion would not yield enough data to reconstruct an image. Since MPRAGE data was non-Cartesian, k-space from each pose is allocated to $y_{synthetic}$ by binning all 47*40 spiral arms into 5 segments. Synthesized data was reconstructed at the original 1 mm isotropic resolution in three different ways, each ignoring the $\delta B_0$ term in Eq. 9:

1. "uncorrected"
2. "motion corrected, fixed-contrast scout" using motion estimates from the QUEEN estimation using the fixed-contrast scout,
3. "motion corrected, Q-Scout" using motion estimates from the QUEEN estimation using the Q-Scout.

Reconstructed images x were evaluated by computing the signal to residual ratio (SRR) with respect to the reference image $x_{ref}$ in decibels: $SRR=10\log_{10}(\overline{|\hat{x}|^2}/\overline{|\hat{x}-x_{ref}|^2})$. $x_{ref}$ is defined as the reconstructed image from $y_{synthetic}$ by using the GT estimates in Eq. 9 (for both $z_n$ and $c_n$).

All experiments were implemented in MATLAB (MathWorks, Massachusetts, USA). For all in-vivo experiments, 10 outer iterations of Eq. 6 are performed, and non-rigid motion (predominantly in the neck region) was suppressed by focusing the estimation on the superior ~⅔$^{rd}$ of the inferior-superior FOV (17). This is achieved by extracting the 21 and 31 most superior elements for both coils respectively. The element's localization was based on the centroids of the sensitivity maps. Therefore, mean absolute errors (MAE) of the $\delta B_0$ estimation in the QUEEN in-vivo experiment is computed for the upper ⅔ of the inferior-superior FOV. Estimations were performed on a 46 Intel® Gold 5320 2.20 GHz CPU, 305 GB RAM where only 10 cores and 10 GB memory were used during job allocation using Slurm (SchedMD). The longest computation time for a single motion+$\delta B_0$ estimation was ~7 min.

Results

Simulations show that the FID navigator results in higher MAE compared to the uncorrected case for both translation and rotation (2.67→3.96 mm and 2.60→3.41°) whereas the SPINS trajectory reduces the MAE (2.67→0.79 mm and 2.60→0.42°. The joint motion+$\delta B_0$ optimization reduces the MAE compared to the motion only estimation for both the FID (3.96→2.21 mm and) 3.41→1.37° and SPINS trajectory (0.79→0.01 mm and) 0.42→0.01°. As for the motion parameters, the SPINS navigator resulted in smaller MAE in $\delta B_0$ compared to both the FID navigator and the uncorrected case (0.11 Hz versus 6.02 and 5.08 Hz, respectively).

Simulations also show that for both translation and rotation, MAE for the fixed-contrast scout is larger (>5°) than the uncorrected case when the navigator contrast does not match the fixed-contrast scout. Using the Q-Scout results in consistently lower residuals (<0.1 mm and) 0.1°. Finally, the accuracy of the Q-Scout informed estimation has a small dependency on signal contrast, yielding highest accuracy in the case of high signal amplitude of the corresponding contrast.

In Vivo: Pose Experiment

Figure 2:
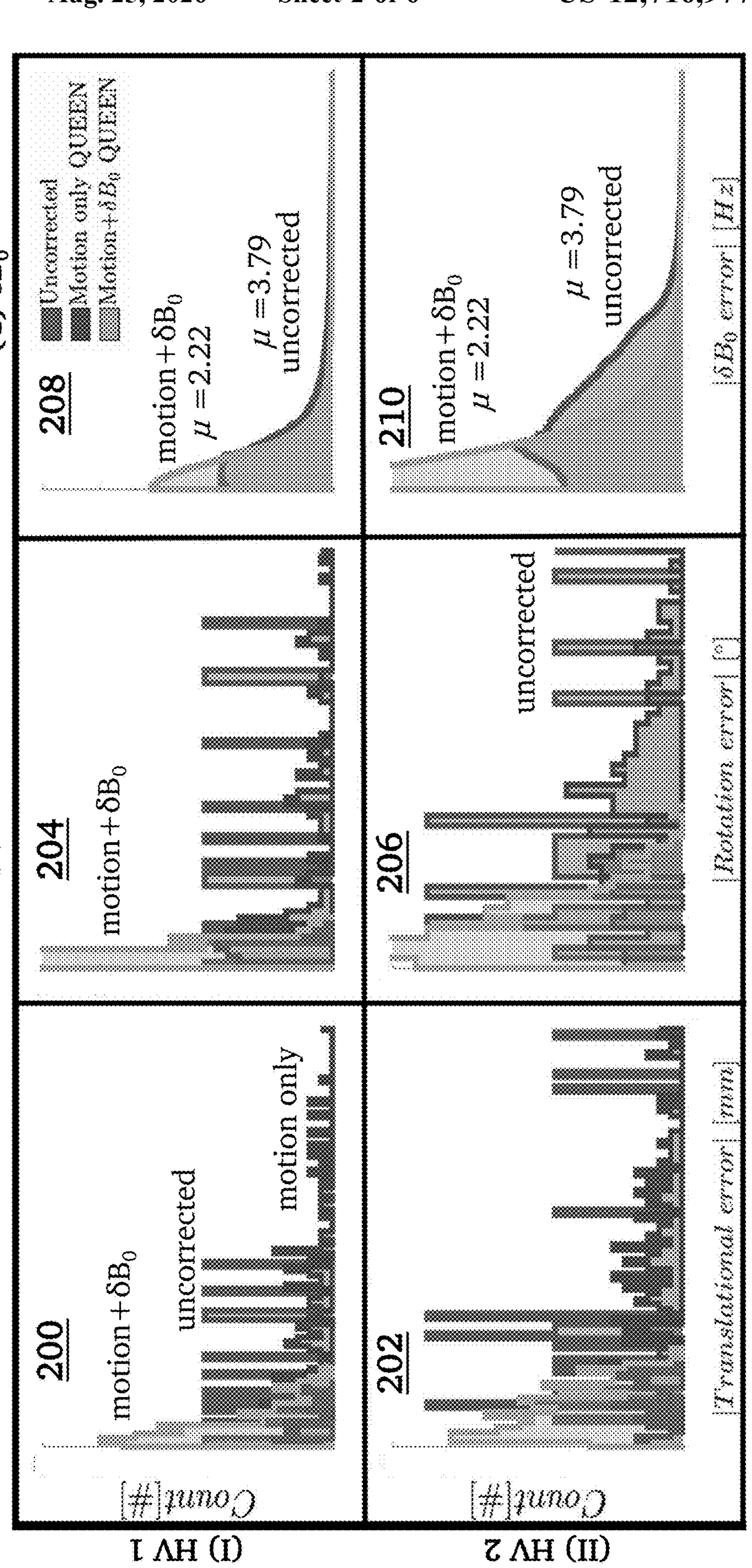
FIG. 2 shows graphs of results of a first experiment, according to an embodiment of the invention.
Figure 3:
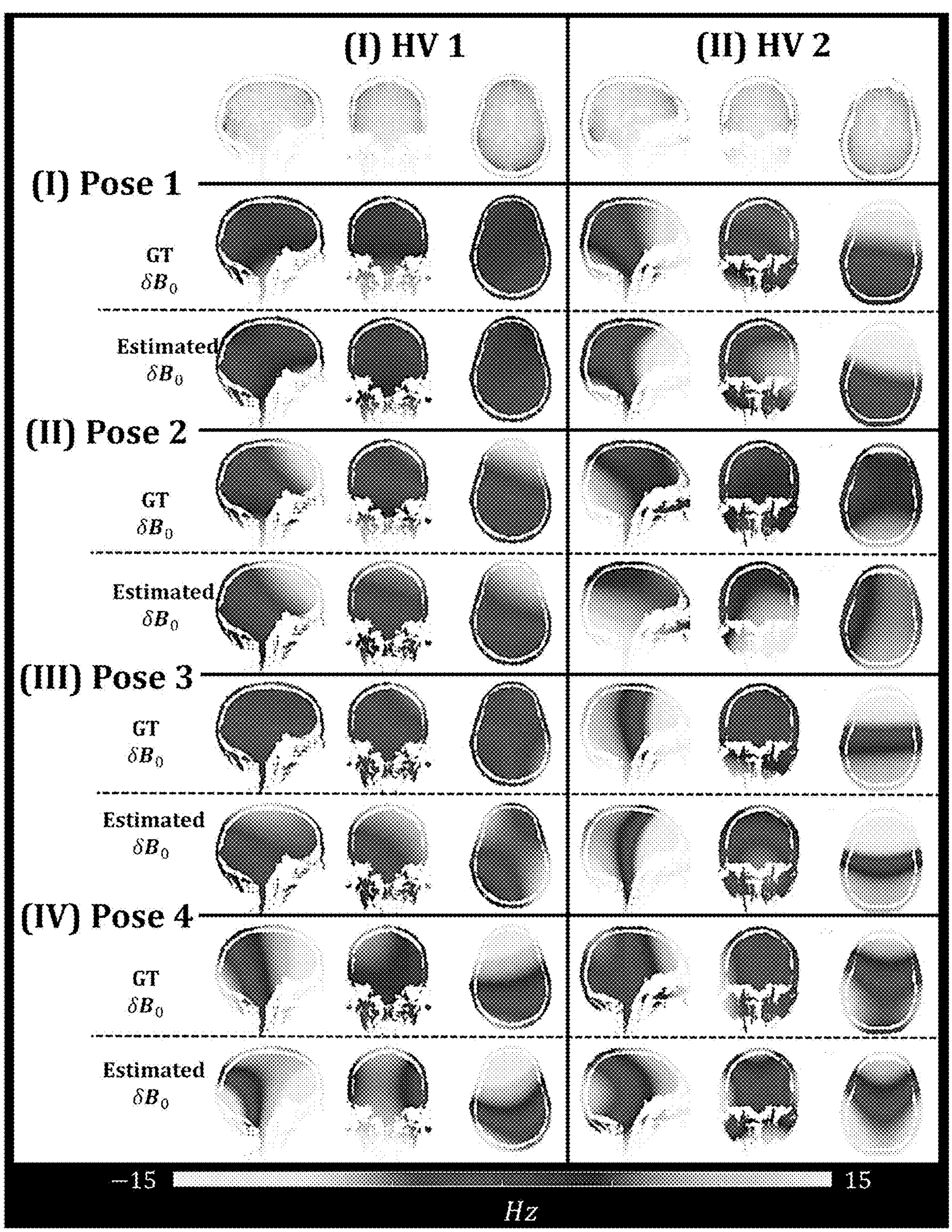
FIG. 3 shows visualization of a QUEEN $\delta B_0$ estimation, according to an embodiment of the invention.

Results of the in-vivo pose experiments are shown in FIGS. 2-4. For Experiment 1 (QUEEN), FIG. 2 shows the histograms of the absolute errors (referred to as "error histograms") of translation, rotation and $\delta B_0$ (left, center, and right columns, respectively) for both HVs (top and bottom rows). Error histograms are shown for the uncorrected, motion only correction and the proposed motion+$\delta B_0$ QUEEN estimation. Mean values u of each distribution are displayed in each sub-figure. The figure shows histograms of the absolute errors in translation 200, 202, rotation 204, 206 and voxel-wise $\delta B_0$ 208, 210 for the QUEEN estimation from in-vivo acquired SPINS navigators acquired in different poses and $\delta B_0$ for HV 1 (top row, 200, 204, 208) and HV 2 (bottom row 202, 206, 210). QUEEN motion estimation is performed without and with additionally estimating $\delta B_0$, and results are compared to the uncorrected case. Mean values (u) of each distribution are added to each error histogram. For both HVs, the MAE of the motion parameters increases compared to the uncorrected case when using the motion only estimation (0.94→2.09 mm/1.8→2.01° and 1.71→2.62 mm/2.25→3.67° for HV 1 and 2). When using the proposed motion+$\delta B_0$ QUEEN estimation, the MAE is reduced to 0.27 mm/0.16° and 0.42 mm/0.46° for both HVs. Compared to the uncorrected case, the $\delta B_0$ is also reduced for both HVs with the proposed method (3.79→2.22 and 5.71→3.11 Hz).

For every pose and HV, the proposed motion+$\delta B_0$ estimation results in improved motion estimates. For HV 1, motion accuracy is <0.4 mm and 0.4° whereas lower motion accuracy is observed in HV 2 (<0.65 mm and 0.9°) which is accompanied by higher absolute pose and $\delta B_0$ parameters. The spatial map of estimated and GT $\delta B_0$ is shown in FIG. 3 for all pose (rows) and HVs (columns). Ground truth (GT)

and estimated $\delta B_0$ are shown for various poses (rows I-IV) and for both HVs (columns I-II). GT $\delta B_0$ is obtained from registering the $B_0$ maps, with an anatomical image added on top as a reference. Overall agreement is observed between the estimated and GT $\delta B_0$. However, close comparison shows residual field errors.

Results of Experiment 2 (Q-Scout) are shown in FIG. 4: bar plots containing the mean (bar) and standard deviation (line) of the AEs are shown for both translation and rotation parameters (top and bottom rows, respectively) and both HVs (left and right columns). Each bar plot contains the AEs for the same navigator contrasts (columns) within all inversion recoveries for both the fixed-contrast scout and Q-Scout. Motion estimates were compared to the uncorrected case on the right. QUEEN motion estimation is performed using a fixed-contrast scout and using a contrast-matched scout predicted by the Q-Scout and results are compared to the uncorrected case.

Note that only a single bar for the uncorrected case is shown as all navigators belong to a single static pose, assuming the same pose parameters for every contrast. Temporal evolution of motion estimates across inversions (within a single-pose acquisition from HV 1) are shown for $TI_{1-4}$ in.

The AEs for the fixed contrast scout estimation show strong contrast-dependent performance, with the highest error when the navigator contrast diverts from the fixed-contrast, reaching even higher AEs than for the uncorrected case. When using the Q-Scout, AE have limited contrast dependence, with all navigators achieving lower errors than the uncorrected case. The mean and standard deviation of the AE across all poses and contrasts using the Q-Scout is 0.20±0.14 mm/0.35±0.3° and 0.16±0.17 mm/0.35±0.44° for respectively HV 1 and HV 2.

In Vivo: Inter-Pose Motion Experiment

Figure 5:
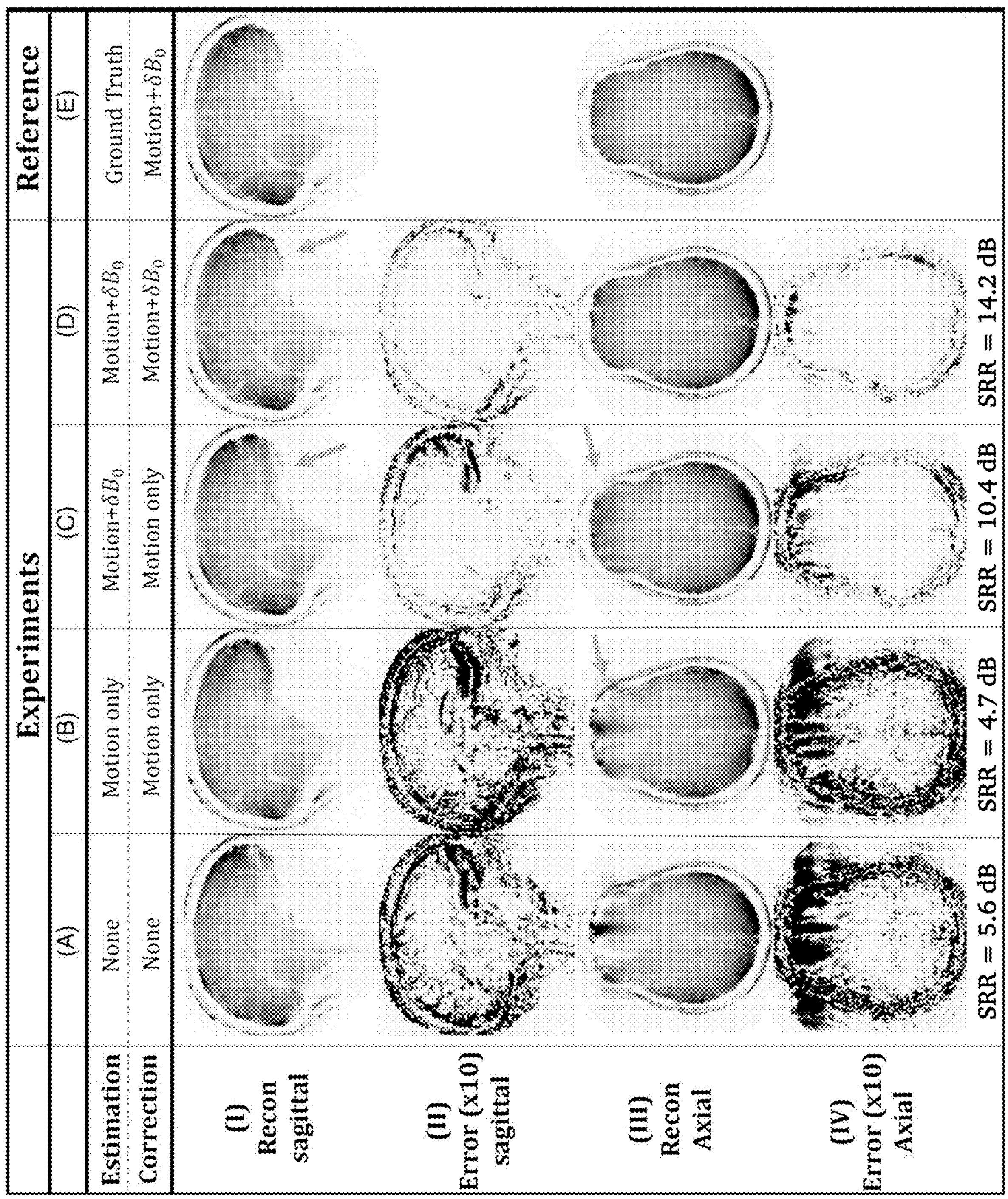
FIG. 5 illustrates inter-pose image correction results using GRE data.

Image reconstructions for Experiment 3.I (GRE data) are shown in FIG. 5, with different columns referring to reconstructions with different estimation and/or correction methods. Rows 1 and 3 show sagittal and axial views, respectively, of the different motion- and $\delta B_0$-informed reconstruction experiments. The reference ground truth images are shown in the right column. Error maps with respect to the reference experiment ground truth are shown in rows 2 and 4, just below the corresponding reconstructions. Experiments and reference reconstructions are defined based on the estimation and correction of both motion and/or $\delta B_0$.

The uncorrected reconstruction in FIG. 5 column A shows clear image artifacts. The motion-corrected reconstruction in FIG. 5 column B using the motion only estimates shows similar image quality and deteriorated SRR (5.6 dB→4.7 dB). Using the motion estimates from the motion+$\delta B_0$ estimation in FIG. 5 column C shows a strong increase in image quality as well as SRR (5.6 dB→10.4 dB). Furthermore, a reduction of image shading and ringing artefacts is observed (arrow in FIG. 5 columns B and C, row III). When additionally correcting for the $\delta B_0$ variations in FIG. 5 column D, signal loss in FIG. 5 column C row I (arrow) is additionally removed and a further increase in SRR is achieved (10.4 dB→14.2 dB). Compared to the reference reconstructions in FIG. 5 column E, rows I and III, no strong visual differences are observed although error plots in FIG. 5 column D rows II and IV show residual artifacts.

Image reconstructions for Experiment 3.II (MPRAGE data) are shown in FIG. 6 using in the same organization as FIG. 5. Rows 1 and 3 show sagittal and axial views, respectively, of the different motion-informed reconstruction experiments. The reference ground truth images are shown in the right column. Error maps with respect to the reference experiment are shown in rows 2 and 4, just below the corresponding reconstructions. Experiments and reference reconstructions are defined based on the estimation and correction of motion parameters.

The uncorrected reconstruction in FIG. 6 column A shows clear image artefacts. The motion-corrected reconstruction in FIG. 6 column B using the fixed-contrast scout motion estimates shows slightly improved image quality and SRR (9.2 dB→12 dB). Using the motion estimates from the Q-Scout-informed estimation results in a strong increase in image quality (FIG. 6 column C) as well as SRR (12 dB→21.7 dB). Compared to the reference reconstructions in FIG. 6 column D, no strong visual differences are observed although error plots in FIG. 6 column C rows II and IV show residual artifacts.

Discussion

We have presented a method to estimate both rigid brain motion and $B_0$-perturbation $\delta B_0$ from navigators using pre-acquired reference data. We also propose the use of a quantitative scout (Q-Scout) instead of the conventional fixed-contrast scout. This enables contrast prediction throughout the entire acquisition and allows contrast-matched scout data for parameter estimation from arbitrary-contrast navigators. An optimization framework for Quantitatively Enhanced parameter Estimation from Navigators (QUEEN) was developed to jointly estimate motion and $\delta B_0$ from navigators with arbitrary k-space trajectory. A dedicated navigator trajectory (SPINS) was deployed that encodes the k-space information needed to robustly estimate motion and $\delta B_0$, whilst still being short enough (3.5 ms) to be interchangeable with most image readouts during a given TR. Conducted simulations have shown that motion and $\delta B_0$ can be accurately estimated from SPINS navigator data and that the SPINS trajectory outperforms the FID navigators. Furthermore, the need for a contrast-matched scout during motion estimation was also demonstrated in simulations for navigators placed throughout an inversion recovery. In vivo experiments confirmed the ability to estimate motion and $\delta B_0$ from SPINS data in a steady-state sequence, with improved performance over the conventional motion only estimation. In-vivo application of SPINS navigators within an inversion-recovery sequence provided consistent performance across all contrasts using the Q-Scout whereas the fixed-contrast scout was limited to navigators with similar contrast.

Simulations confirmed that using the joint motion $+\delta B_0$ estimation results in improved motion estimation. Although previous work achieves robust motion correction using FID in the absence of strong $\delta B_0$ (26), this work shows that in the presence of strong $\delta B_0$, FID cannot provide robust motion estimation and tailored trajectories like SPINS improve the estimation performance. In this first proof of concept study, it was only feasible to test a single navigator trajectory, but there is scope to explore optimized trajectory designs. Additionally, a systematic analysis of model imperfections (e.g. gradient imperfections (40), contribution from fat signal (41), etc.) and their effect on the QUEEN performance would be useful. Simulation 2 (Q-Scout) confirmed that matching scout contrast allows for consistent and accurate motion estimation from arbitrary-contrast navigator data. MAE remain under 0.1 mm and 0.1° for the added noise level and a pose range of ±5 mm/°.

Experiment 1 (QUEEN) in FIG. 2 confirms overall improved motion estimation in vivo when additionally estimating $\delta B_0$ in the presence of $B_0$-perturbations. Additionally, $\delta B_0$ estimates are consistent with the separately measured GT values. In contrast to the simulations, using the motion only estimation showed increased motion errors compared to the uncorrected case. Additionally, the MAE levels across poses and HVs of motion estimates using the QUEEN is higher than in simulations (~0.4 mm and ~0.5° compared to the 0.1 mm and) 0.1° and might not be sufficient to fully correct motion in high-resolution acquisitions. This is hypothesized to be caused by nonidealities in the forward model as well as the uncertainty in the estimated GT parameters obtained using image registration. Detailed analysis of the navigator signal did show signal contaminations that could not be explained by the Q-Scout and motion- and $\delta B_0$-informed model. These signal contaminations could come from multiple effects: first, gradient imperfections could lead to trajectory deviations as well as $B_0$ variations throughout a single readout. Secondly, signal from fat tissue that is insufficiently suppressed by the SLfRank pulse (in vivo GRE in the QUEEN experiment) or not suppressed at all (in vivo MPRAGE in the Q-Scout experiment) will add off-resonance signal not included in the signal model. Finally, although the HVs are instructed to hold a static pose during each acquisition, within-scan subject motion could have occurred. Motion estimates across multiple navigators within an acquisition showed indeed small fluctuations although no strong evidence exists whether these are related to genuine within-acquisition motion or other effects.

Experiment 2 (Q-Scout) in FIG. 4 confirms that using the Q-Scout to match scout contrast allows for consistent and more accurate motion estimates from arbitrary-contrast navigator data. Although choosing a later time point in the inversion recovery as the fixed-contrast scout could improve the overall baseline performance as this sequence quickly reaches a slow-recovery state with little contrast changes (~after the $4^{th}$ navigator), the experiment shows the potential of the Q-Scout in a sequence where similar contrast is not often achieved (e.g. MRF). Consistent with the observation in Experiment 1, the accuracy of the motion estimates (~0.2 mm)/0.4° is lower than the ones obtained in Simulation 2 and the imperfections mentioned above for Experiment 1 are likely to also have affected Experiment 2.

Experiment 3 (inter-pose image correction) in FIG. 5, 6 confirms Hypothesis 3. For Experiment 3.1 in FIG. 5, motion correction using the motion only estimation does not improve image quality, whereas motion correction using the motion estimation from the motion+$\delta B_0$ estimation achieves clear improvements. Additionally, correcting for $\delta B_0$ further improves images quality indicating that the $\delta B_0$ estimates are accurate enough to be used in image reconstruction. For Experiment 3.II in FIG. 6, motion correction using the fixed-contrast scout only marginally improves image quality, whereas using the Q-Scout estimation achieves clear improvements.

CONCLUSION

We have developed a framework that jointly estimates rigid motion parameters and $\delta B_0$ from navigators. This work builds upon current state-of-the-art methods by adding the joint estimation and contrast-matched scout to previously presented scout-informed estimation methods from navigators. Combing a contrast-matched scout with the proposed trajectory allows for navigator deployment in almost any sequence and/or timing, enabling higher-temporal resolution motion and $\delta B_0$ estimates.

Appendix: Levenberg-Marquardt Updates for the Motion and $\delta B_0$ Parameters The Levenberg-Marquardt (LM) optimization in Eq. 6 consists of estimating the motion (z) and $\delta B_0$ (c) parameters from k-space acquisitions:

$$z^{i+1} = \text{argmin}_z \sum_{n=1:N} \left\| \mathcal{F}_n S T(z) P_n(c) Q_{s_n} - y_n \right\|_2^2 = \text{argmin}_z L(z)$$

$$c^{i+1} = \text{argmin}_c \sum_{n=1:N} \left\| \mathcal{F}_n S T(z) P_n(c) Q_{s_n} - y_n \right\|_2^2 = \text{argmin}_c L(c)$$

where L is the data-consistency loss function. Definitions of the operators can be found in the main body of the text. By defining the gradient of L with respect to both motion (z) and $\delta B_0$ (c) parameters as $$\nabla_z^L$$

and $$\nabla_c^L,$$

the parameter updates are given by:

$$z^{i+1} = z - \left(\lambda_z^i + \nabla_z^{L^H} \nabla_z^L\right)^{-1} \nabla_z^L$$

$$c^{i+1} = c - \left(\lambda_c^i + \nabla_c^{L^H} \nabla_c^L\right)^{-1} \nabla_c^L$$

where $$\lambda_z^i$$

and $$\lambda_c^i$$

are the LM hyper-parameters for both optimization problems that are updated every iteration. Note that the update equation does not include a Jacobian as the Jacobian is identical to the gradient $\nabla$ for scalar functions like L (L(z): $\mathbb{R}^{6\times1} \rightarrow \mathbb{R}$ and L(c): $\mathbb{R}^{9\times1} \rightarrow \mathbb{R}$ R).

Elements of $$\nabla_z^L$$

are computed using $$\nabla_{z_l}^L = 2 \sum_n \Re\left(w_n^H w_{n,z_l}\right)$$

where $\mathcal{F}$ extracts the real component and $$w_n = \mathcal{F}_n S T(z) P_n(c) Q_{s_n} - y_n$$

$$w_{n,z_l} = \mathcal{F}_n S \frac{\partial T(z)}{\partial z_l} P_n(c) Q_{s_n}$$

Implementation details of $$\frac{\partial T(z)}{\partial z_l}$$

are known in the art.

Elements of $$\nabla_c^L$$

are computed using $$\nabla_{c_l}^L = 2\sum\nolimits_n \mathbb{R}\left(w_n^H w_{n,c_l}\right)$$

where $$w_{n,c_l} = \mathcal{F}_n S T(z) \frac{\partial P_n(c)}{\partial c_l} Q_{s_n} = 2\pi i t_n \mathcal{F}_n S T(z) D(L_{:,l}) P_n(c) Q_{s_n}$$

In the last equation, $D(L_{:,l})$ is a diagonal matrix with the elements of $L_{:,l}$ on the diagonal and i now represents the imaginary number.

The invention claimed is:

1. A method for magnetic resonance imaging with motion estimation, the method comprising:

a) performing with a magnetic resonance imaging apparatus a quantitative scout acquisition to produce a data acquisition sequence;

b) predicting, based on the data acquisition sequence, navigator data throughout an entirety of the data acquisition sequence;

c) performing joint motion and $\delta B_0$ estimation from the navigator data.

2. The method of claim 1 wherein the quantitative scout acquisition comprises a 4 mm or more isotropic resolution quantitative mapping sequence in the time order of a couple of seconds, resulting in maps to predict signal contrast throughout the data acquisition sequence.

3. The method of claim 1 wherein the data acquisition sequence comprises acquisition time of at least 2 ms allotted for short navigators.

4. The method of claim 1 wherein predicting navigator data comprises using a signal model and an imaging acquisitions structure to predict signal variation across the data acquisition sequence.

5. The method of claim 1 wherein the navigator data comprises time-varying image contrast-matched scout navigator data.

6. The method of claim 1 wherein performing joint motion and $\delta B_0$ estimation comprises performing a model-based joint estimation of both rigid patient motion and polarizing magnetic field perturbations.

7. The method of claim 1 wherein performing joint motion and $\delta B_0$ estimation comprises estimating motion parameters and $\delta B_0$ parameters iteratively using a Levenberg-Marquardt algorithm.

8. The method of claim 1 further comprising reconstructing an MRI image using the estimated motion and $\delta B_0$.

* * * * *